(12) United States Patent
Satoh et al.

(10) Patent No.: US 6,171,390 B1
(45) Date of Patent: Jan. 9, 2001

(54) METHOD FOR PREPARING OXIDE SINGLE CRYSTALLINE MATERIALS

(75) Inventors: Hidetaka Satoh; Makoto Kambara; Kouichi Miyake; Yuh Shiohara, all of Tokyo (JP)

(73) Assignee: Superconductivity Research Laboratory, Tokyo (JP)

(*) Notice: Under 35 U.S.C. 154(b), the term of this patent shall be extended for 0 days.

(21) Appl. No.: 09/273,053

(22) Filed: Mar. 19, 1999

(30) Foreign Application Priority Data

Mar. 20, 1998 (JP) .................................................. 10-092681

(51) Int. Cl.[7] .................................................. C30B 11/04
(52) U.S. Cl. .................................................. 117/11
(58) Field of Search .................. 117/11, 944; 505/779, 505/780, 781, 729

(56) References Cited

U.S. PATENT DOCUMENTS 5,611,854 * 3/1997 Veal et al. ........................ 117/1
5,776,864 * 7/1998 Todt et al. .......................... 505/450
5,869,431 * 2/1999 Veal et al. ............................ 505/234

* cited by examiner

Primary Examiner—Benjamin L. Utech
Assistant Examiner—Matthew Anderson
(74) Attorney, Agent, or Firm—Flynn, Thiel, Boutell & Tanis, P.C.

(57) ABSTRACT

There is provided a method for preparing a large and perfect oxide crystal useful for oxide superconductors and laser transmitting elements. In the present method for preparing a large oxide single crystalline material such as superconductive crystals of RE123, a crystal precursor material is supercooled prior to the solidification thereof in the course of crystal growth of the oxide by a supercooling solidification process, followed by subjecting said precursor material to continuous slow heating while keeping the supercooled condition to promote crystal growth, as shown in FIG. 7. Seed crystals may be added to the crystal precursor material prior to solidification, if necessary, as also shown in FIG. 7.

4 Claims, 5 Drawing Sheets

SCALE (ONE DIVISION = 1mm)

SCALE (ONE DIVISION = 1 mm)

METHOD FOR PREPARING OXIDE SINGLE CRYSTALLINE MATERIALS

BACKGROUND OF THE INVENTION

1. Field of the Invention

The present invention relates to a method for preparing large oxide single crystalline materials useful as a "RE123 oxide superconductor" or "LiNdO$_3$ oxide laser transmitting element", respectively.

2. Description of the Related Art

Recently, there has been remarkably developed a new technology utilizing specific properties of oxide crystalline materials and, for example, crystalline materials of RE123 oxides (wherein RE represents one or more rare earth elements) and LiNdO$_3$ crystalline materials play an important part as a high temperature superconductive material and a laser transmitting element, respectively.

The "Solidification process" has been conventionally known as a general procedure to yield oxide crystalline materials used for the above mentioned purpose, in which a molten material, i.e., crystalline precursor material, is cooled at a slow speed from a temperature around the melting point to promote solidification and crystal growth.

In such a conventional process as described above, however, it takes a long period of time to yield the desired crystals, which is practically disadvantageous.

In order to improve the conventional disadvantage by reducing the time period of crystal growth, the "supercooling (undercooling) solidification process" has been proposed as a novel crystal growing method.

The supercooling solidification process is a single crystal growing method utilizing such characteristics that "when a molten or semi-molten liquid of an oxide crystal precursor is supercooled, i.e., kept in a supercooled condition at a temperature below the melting point, the crystal growth rate is remarkably accelerated". Several methods for preparing Y-oxide superconductive crystals based on the above mentioned supercooling method have been described in, for example, JP-A No. 6-211,588; Journal of Materials Research, Vol. 11, No. 4, pp. 795–803, April 1996; and ibid., Vol. 11, No. 5, pp. 1114–1119, May 1996.

According to the above mentioned references including JP-A No. 6-211,588, the most characteristic feature is that "A Y-oxide superconductor precursor material, which has been added with a seed crystal as nuclei for crystal growth followed by raising the temperature above the peritectic temperature or raising the temperature above the peritectic temperature followed by addition of the seed crystal, is subjected to supercooling (undercooling) by cooling it under the peritectic temperature and further cooling it continuously but slowly, for example at a cooling rate of 1° C./ hr. or isothermally keeping it at the supercooled temperature to grow Y-oxide superconductor crystals, the oxides never solidify at once completely when they are supercooled, which is distinct from pure metals". On the other hand, the "supercooling solidification process" is a method for growing crystals in which a molten precursor material is supercooled to a temperature region below the melting point in a molten or semi-molten state and then slowly cooled, usually at a cooling rate of 1 to 10° C./hr., or kept at the supercooled temperature, and the existence of the above mentioned "seed crystal" is not necessarily essential to the process. That is, such a process is employed for a purpose to increase the crystal growth rate.

FIG. 1 shows a relationship between the crystal growth rate of Sm123 and the degree of supercooling. It is apparent from FIG. 1 that the crystal grow rate increases as an increase in the degree of supercooling.

The inventors have investigated the preparation of larger oxide single crystals from various viewpoints and come to a conclusion that the supercooling solidification process has a limit in the preparation of large single crystals and is not sufficient to yield homogeneous large single crystals with less defects.

As evident from FIG. 1, the crystal growth rate increases as an increase in the degree of supercooling, resulting in it being possible to prepare large crystals in a short time.

However, as evident from the relationship between supercooling degree and frequency of nucleation in FIG. 2, the nucleation increases rapidly relative to an increase in the degree of supercooling.

The increase in the frequency of nucleation inhibits the preparation of large single crystals (for example, crystals grown from seed crystals), resulting in a limitation of the size of single crystals.

SUMMARY OF THE INVENTION

Accordingly, it is an object of the present invention to provide a method for easily preparing large and perfect oxide single crystals without consuming a longer time.

To accomplish this and further objects of the present invention, the inventors have keenly investigated and finally obtained novel information in which, when a highly heated oxide crystal precursor material is supercooled below the melting point and then subjected to continuous slow heating within the supercooling region to grow crystals, nucleation which hinders single crystal particles from growing is controlled, while keeping a high crystal growth rate, so that large single crystals can be grown without consuming a longer period of time.

The present invention has been achieved on the basis of the above mentioned information and provides a method for preparing a large oxide single crystalline material as in the following.

1. A method for preparing a large oxide single crystalline material, characterized in that a crystal precursor material is supercooled prior to the solidification thereof in the course of the crystal growth of an oxide by a supercooling solidification process, followed by subjecting said precursor material to continuous slow heating while keeping the supercooled condition to promote crystal growth.

2. A method for preparing a large RE123 oxide superconductive single crystalline material, wherein RE is one or more rare earth elements in which Y is not excluded, characterized in that a RE123 oxide superconductive crystalline precursor material added with seed crystals is supercooled below its peritectic temperature prior to the solidification thereof in the course of crystal growth of the RE123 oxide superconductive crystal, followed by subjecting said precursor material to continuous slow heating while keeping the supercooled condition to promote crystal growth.

Oxide crystals prepared by the present invention are not limited to a specific oxide but may cover any material including the above mentioned LiNdO$_3$ oxide crystal used as a laser transmitting element. Especially, an excellent practical effect is exhibited when the present invention is applied to prepare RE123 oxide superconductive single crystalline materials in which the growth of large crystals has been difficult.

DESCRIPTION OF THE PREFERRED EMBODIMENT

The present invention will be described with respect to the functions thereof.

Figure 1:
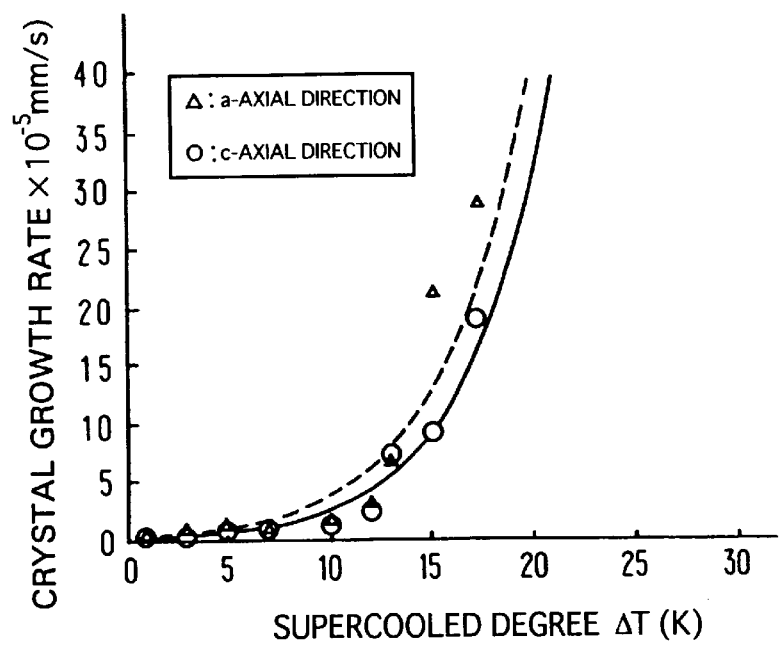
FIG. 1 is a graph showing a relationship between crystal growth rate of Sm123 oxide and supercooling degree.

As shown in FIG. 1, the crystal growth rate increases with an increase in the supercooling degree when an oxide crystal is grown by a supercooling solidification process. As a result, it is possible to remarkably reduce the time period required to grow an oxide crystal according to the supercooling solidification process.

When the supercooled degree increases, however, the frequency of nucleation in a molten or semi-molten material is enhanced extraordinarily, thereby the growth of a single crystal being inhibited by crystals grown from nuclei.

Figure 2:
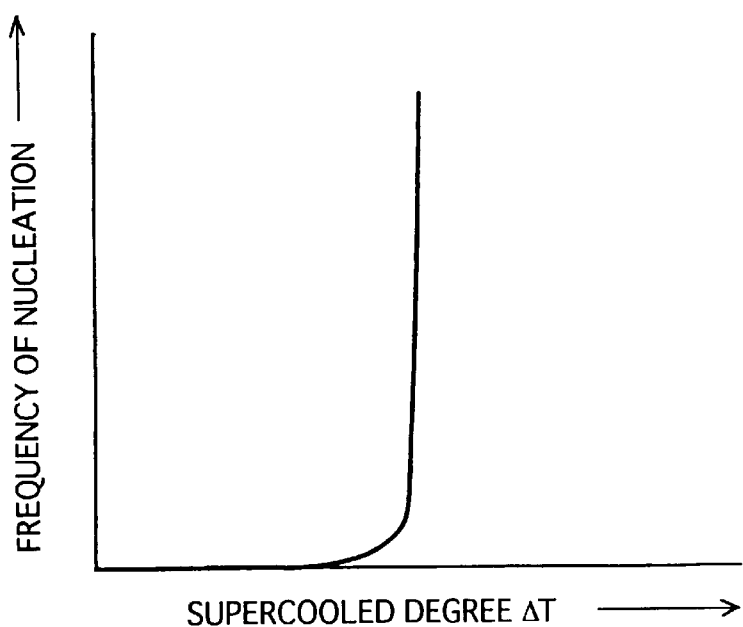
FIG. 2 is a graph showing a relationship between supercooling degree and frequency of nucleation.

FIG. 2 shows a relationship between the supercooled degree and the frequency of nucleation. It is apparent from FIG. 2 that the frequency of nucleation increases exponentially with an increase in the supercooled degree. That is, conversely speaking, the frequency of nucleation decreases drastically with a decrease in the supercooled degree, which is achieved by slowly heating a condition of higher supercooled degree.

It is clear from FIGS. 1 and 2 that nucleation from a crystal precursor material prior to solidification can be drastically reduced, while a decrease in crystal growth rate is controlled to a low level when a crystal precursor material is supercooled prior to the solidification thereof in the course of crystal growth by a supercooling solidification process, followed by subjecting the precursor material to slow heating to gradually reduce the supercooled degree without further slowly cooling from a supercooled temperature thus obtained or isothermally keeping this temperature as in a conventional manner.

The crystal growth rate increases with an increase in the supercooling degree while the frequency of nucleation increases exponentially with an increase in the supercooled degree. On the contrary, in the case where the supercooled degree is reduced by slow heating, the reduction of the crystal growth rate is small relative to the reduction of the frequency of nucleation.

That is, an application of slow heating while keeping a supercooled condition makes it possible to decrease the supercooled degree so as to remarkably reduce the nucleation caused by an intentional nucleating source such as seed crystals and, at the same time, to control such intentional crystal growth rate so as to keep the growth rate at a high level and to prepare perfect and large oxide single crystals within a relatively short period of time.

Accordingly, nucleation other than at an intentional site such as seed crystals can be inhibited so that crystals grown from seed crystals can be large-sized.

As shown in FIGS. 1 and 2, the effect of changes in supercooled degree is gentle on the crystal grow rate and expressed as a unit of length (mm/sec). On the other hand, such an effect is extreme on the frequency of nucleation and expressed as "numbers of produced nuclei/$mm^3 \cdot sec$", i.e., the size of the sample being exclusively defined by a time period regardless of either rapid or slow growth rate, and, in addition, nucleation occurs almost in a moment as shown in FIG. 2. It is the most characteristic feature of the present invention to make use of this difference so as to promote effective crystal growth while keeping "a supercooled region of lower degree" where nucleation does not occur.

As the crystal growth rate of oxides is slower than that of metals and other materials, control of supercooling in the supercooled region is comparatively easy. Accordingly, it is possible to produce a temperature gradient through slow heating without missing the supercooled region while controlling external heat.

Such slow heating while keeping a supercooled condition, for example, at a heating rate of about several ° C. per 100 hours, does not cause an industrial problem.

Figure 3:
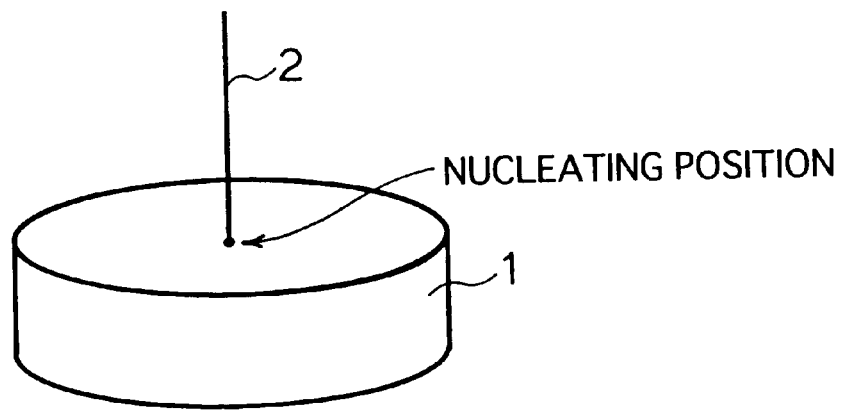
FIG. 3 illustrates an example of a means of introducing a nucleating source into an oxide crystalline material.
Figure 4:
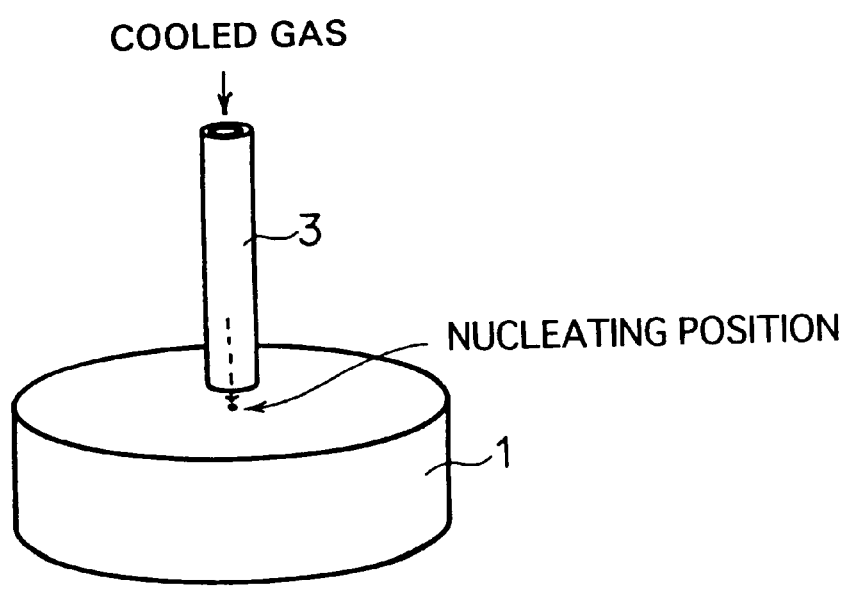
FIG. 4 illustrates another example of a means for introducing a nucleating source into an oxide crystalline material.
Figure 5:
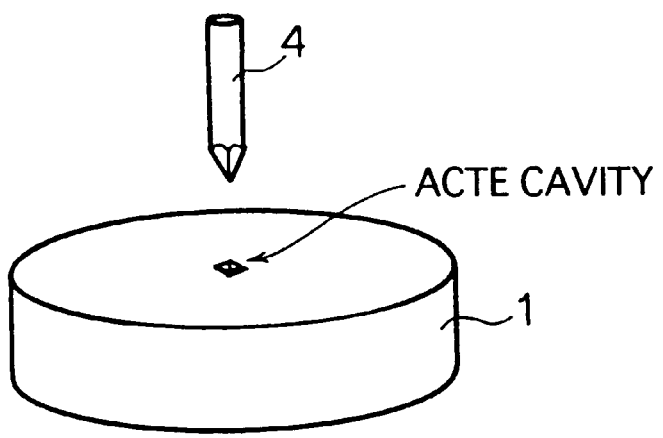
FIG. 5 illustrates still another example of a means for introducing a nucleating source into an oxide crystalline material.
Figure 6:
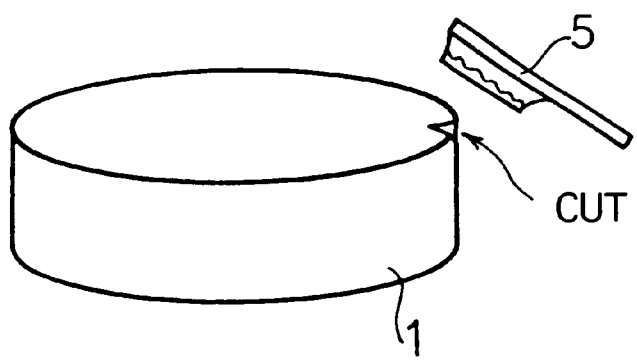
FIG. 6 illustrates a further example of a means for introducing a nucleating source into an oxide crystalline material.

A source of nuclei which is intentionally introduced into a crystal precursor material to grow single crystals in the present invention includes well known "seed crystals" and may also be prepared as in the following:

(1) One end of a satisfactorily heat-resistant and heat-conductive metal wire 2 such as Pt, Rh, etc., in a cooled condition, is brought into contact with a nucleating position of an oxide crystal precursor material 1 which has been molten or semi-molten by high temperature heating as shown in FIG. 3, the material in a molten condition being kept in a crucible;

(2) A fine oxide tube 3 is put close to a nucleating position of an oxides crystal precursor material 1 which has been molten or semi-molten by high temperature heating, while blowing cooled air through the tube 3 to partially cool the material 1 as shown in FIG. 4; and (3) An acute cavity or cut is formed at a nucleating position on a molten or semi-molten crystal precursor material 1 which shape can be kept from deformation by means of an acute drill-like tool 4 as shown in FIG. 5 or a sharp knife-like blade 5 as shown in FIG. 6, respectively.

For preparation of a RE123 superconductive single crystalline material according to the present invention, it is possible to yield a single crystalline material of about 40 mm in diameter, which is nearly two times the size of a conventional one. The conventional "supercooling solidification process" yields a single crystalline product of at most 20 mm or so in diameter.

Further, when oxide superconductors of a higher Tc (critical temperature), such as those of $Nd_{(16)}$ or $Sm_{(14)}$ types are prepared by the conventional "supercooling molten solidification process" in which crystal growth proceeds under a slow cooling condition in a supercooled region, Nd or Sm and Ba replaced each other in the course of crystal growth, thereby causing an inconvenient change in composition between starting and terminal portions of the crystals.

According to the method of the present invention, however, large RE123 oxide superconductive crystals can be stably grown without causing such an inconvenience.

Although the present invention will be further described by a specific example together with a comparative example, it should be understand that the spirit and scope thereof is not limited by such examples.

EXAMPLE

Starting powders of $Sm_2O_3$, $BaCO_3$ and $CuO$ were prepared, weighed and mixed to form a composition "$SmBa_2Cu_3O_{7-d}$+40 mol % $Sm_2BaCuO_5$". The thus obtained mixture was then calcined to form a calcined disk material of 40 mm in diameter and 20 mm in height.

The calcined disk material was then put on a magnesia single crystal plate and placed in a soaking zone a of heating oven to form a semi-molten material by raising the temperature up to 1150° C. in the atmosphere, followed by maintaining such a condition for 30 minutes.

The semi-molten material was then cooled to 1,080° C., i.e., around the "peritectic temperature (about 1,065 to 1,070° C.) of Sm123 crystal ($SmBa_2 CU_3 O_{7-d}$ single crystal)" within 10 minutes, kept at this temperature for one hour to render the material as a whole isothermal, followed by seeding a Nd123 single crystal (Nd $Ba_2$ $Cu_3$ $O^{7-d}$ single crystal), which was immediately quenched to 1,055° C. to subject it to supercooling.

Further, the semi-molten material was slowly heated for 100 hours up to 1,065° C. at a heating rate of 0.1° C./hr. to yield a large single crystal of Sm123 grown from the seed crystal (Nd 123 single crystal). The oven was cooled to room temperature after the material was slow-heated for 100 hours.

Figure 7:
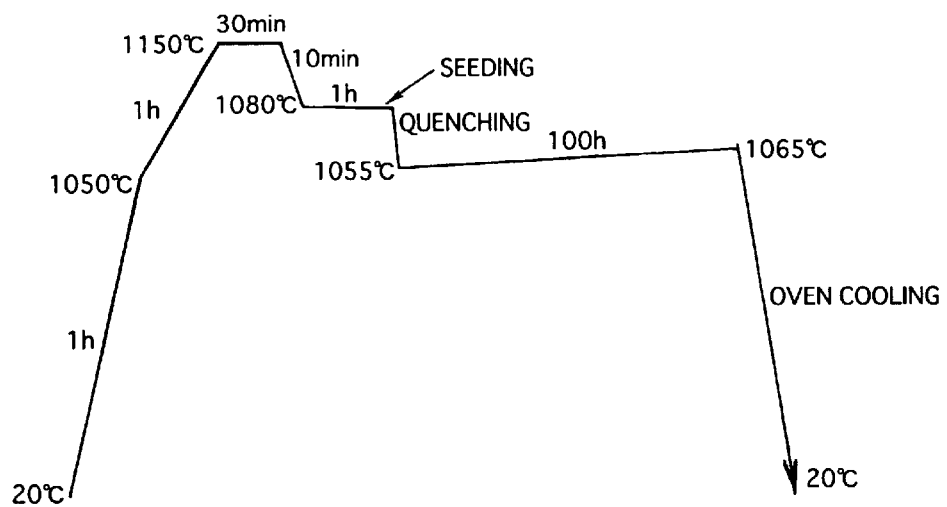
FIG. 7 is a heat treatment hysteresis curve of a material used in an example.
Figure 8:
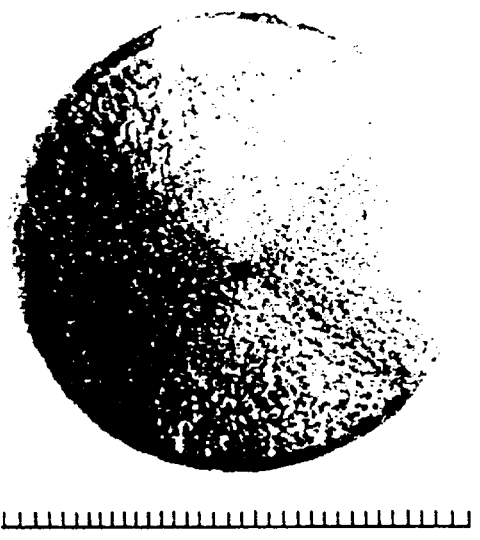
FIGS. 8A and 8B are an Sm123 single crystal prepared by the above mentioned example.
Figure 8:
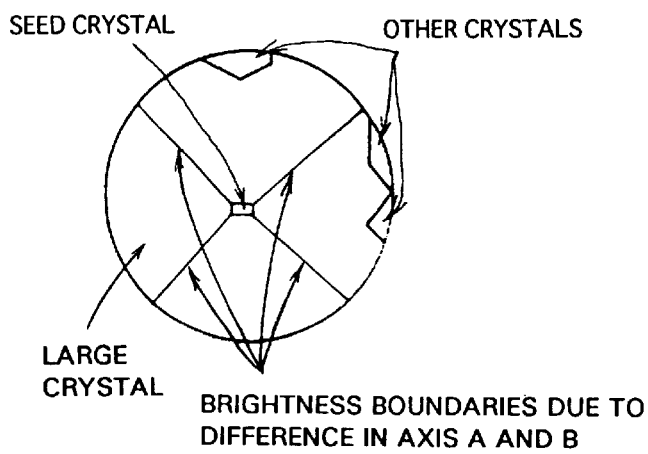

FIG. 7 shows a heat treatment hysteresis of the material starting from calcination to completion of oven cooling after crystal growth. FIG. 8 shows the appearance of a Sm123 single crystal thus obtained, in which FIG. 8(a) is a visual photograph of the crystal and FIG. 8(b) is an illustration thereof.

It is confirmed from FIG. 8 that a large Sm123 single crystal of about 35 mm in diameter can be prepared by the above mentioned example according to the present invention.

The thus obtained Sm123 single crystal shows a critical temperature of 90 K or more as superconductive properties.

COMPARATIVE EXAMPLE

A calcined disk material having a composition "$SmBa_2Cu_3O_{7-d}$+40 mol % $Sm_2BaCuO_5$" prepared under a similar condition as that of the Example was subjected to heating, cooling and seeding, and immediately followed by supercooling while quenching to 1.060° C.

The thus obtained semi-molten material was kept at an isothermal temperature of 1.060° C. for 72 hours to allow a crystal to grow and then cooled to room temperature by cooling the oven.

Figure 9:
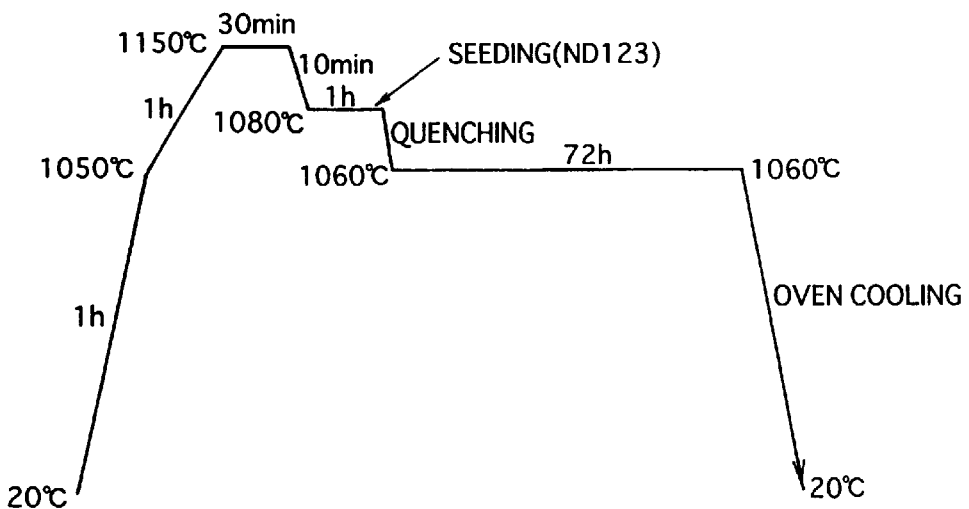
FIG. 9 is a heat treatment hysteresis curve of a material used in a comparative example.

FIG. 9 shows a heat treatment hysteresis of the material starting from calcination to completion of oven cooling after crystal growth.

Figure 10:
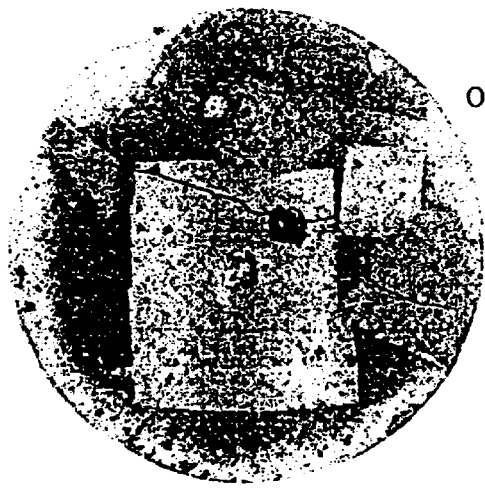
FIGS. 10A and 10B are an Sm123 single crystal prepared by the above mentioned comparative example.
Figure 10:
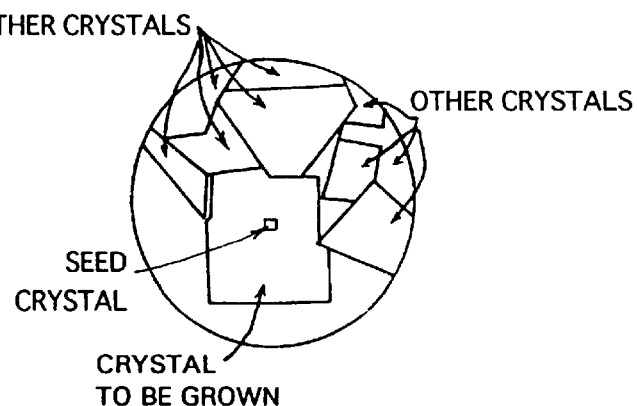

FIG. 10 shows the appearance of a Sm123 single crystal thus obtained, in which FIG. 10(a) is a visual photograph of the crystal and FIG. 10(b) is an illustration thereof.

It is confirmed from FIG. 10 that, according to the conventional "supercooling molten solidification process", crystal growth from a seed crystal is remarkably inhibited by crystals which have grown by nucleation other than at the seed crystal, and the size of Sm123 single crystal grown from the seed crystal is as large as at most about 20 mm in diameter.

As has been described above, according to the present invention, it is possible to prepare large and perfect oxide single crystals at an improved productivity without using complicated and expensive equipment, which greatly heightens industrial effects including, for example, contribution to cheep production of oxide superconductors of high quality.

What is claimed is:

1. A method for preparing a large oxide single crystalline material, characterized in that a crystal precursor material is supercooled prior to solidification thereof in the course of crystal growth of the oxide by a supercooling solidification process, followed by subjecting said precursor material to continuous slow heating while maintaining said precursor material in a supercooled state to promote crystal growth.

2. The method of claim 1, wherein said slow heating is at a rate of 0.1° C./hr.

3. A method for preparing a large RE123 oxide superconductive single crystalline material, characterized in that a RE123 oxide superconductive crystalline precursor material added with seed crystals is supercooled below peritectic temperature prior to solidification thereof in the course of crystal growth of the RE123 oxide superconductive crystal, followed by subjecting said precursor material to continuous slow heating while maintaining said precursor material in a supercooled state to promote crystal growth.

4. The method of claim 3, wherein said slow heating is at a rate of 0.1° C./hr.

* * * * *